United States Patent
Hermann, Jr. et al.

(10) Patent No.: US 6,296,499 B1
(45) Date of Patent: Oct. 2, 2001

(54) CONTACT FOR ERROR RESISTANT COUPLING OF ELECTRICAL SIGNALS

(75) Inventors: Henry Otto Hermann, Jr., Elizabethtown; Marjorie Kay Myers, Mount Wolf, both of PA (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/042,400

(22) Filed: Mar. 13, 1998

(51) Int. Cl.$^7$ .................................................. H01R 13/53
(52) U.S. Cl. ........................ 439/181; 439/59; 439/931; 439/951
(58) Field of Search .......................... 439/181, 924.1, 439/951, 59, 931

(56) References Cited

U.S. PATENT DOCUMENTS

| | | |
|---|---|---|
| 1,770,839 | 7/1930 | Carpenter . |
| 2,716,737 | 8/1955 | Maberry . |
| 4,002,396 | 1/1977 | Murdock . |
| 4,079,440 | 3/1978 | Ohnuma et al. . |
| 4,117,291 | 9/1978 | Gebauer . |
| 4,245,270 | 1/1981 | Busby . |
| 4,747,783 | 5/1988 | Bellamy et al. . |
| 4,838,799 | 6/1989 | Tonooka . |
| 5,213,517 | 5/1993 | Kerek et al. . |

OTHER PUBLICATIONS

IBM Technical Disclosure Bulletin, vol. 32, No. 2, Jul. 1989.

*Primary Examiner*—Paula Bradley
*Assistant Examiner*—Truc Nguyen (57) ABSTRACT

A signal connector assembly with a plug contact within a plug having a high resistive portion. When the plug of the assembly first makes contact with the electrical receptacles within a mating receptacle, the high resistive portion prevents a current surge. As the plug is further inserted into the receptacle, the energy passing from the plug to the receptacle is gradually increased. Eventually, the receptacle contacts within the receptacle pass the high resistive portion and make contact with the conductive portion of the plug contact, thereby permitting transmission of valid signals without the generation of spurious errors.

25 Claims, 8 Drawing Sheets

TOP VIEW

FIG. 4h

SIDE VIEW

CONTACT FOR ERROR RESISTANT COUPLING OF ELECTRICAL SIGNALS

BACKGROUND OF THE INVENTION

1. Field of the Invention

This invention relates generally to electrical connectors for electronic devices. More particularly, the invention relates to electrical contacts for use in electrical connectors to prevent the generation of spurious signals upon mating of the connector.

2. Description of the Related Art

Electrical connectors for use with peripheral electronic devices are well known in the art. A recurrent problem with many prior art connectors is the generation of spurious signals upon mating of a peripheral electronic device to an electronic system which is already energized. The connector may induce a voltage pulse into the energized electronic system. The voltage pulse may travel through the electronic system, thereby introducing spurious errors into the system. This problem is known in the art as the "hot plug" problem.

This condition that causes errors in electronic systems results from the very high data rates and very low energy of the signals within the systems. The input capacitance of the connector, printed circuit board lines and device capacitance of the buffer integrated circuit devices are the basis of the problem. Energy must flow from the system bus to charge this input capacitance, (generally tens of picofarads). When energy is removed from the system bus, a voltage pulse to an adjacent device on the bus occurs, thereby creating errors in the system. The voltage pulse may be no greater than normal signals so no new radiated noise problem is introduced. However, it can cause data to be incorrectly transferred. Accordingly, the interconnections themselves are a large portion of the problem. This problem is universal since it affects both digital and analog electronic devices.

The prior art has generally addressed the "hot plug" problem by using logic and timing control circuitry, such as that which is disclosed in U.S. Pat. No. 4,245,270 to slowly ramp up the voltage within the connecting line. However, providing the additional circuitry is complex and expensive.

Many connecting schemes require certain portions of the connector to be mated prior to other portions, or in a particular sequence. For example, with respect to power applications, U.S. Pat. No. 4,079,440 discloses a circuit board having two connector plugs of differing lengths. The longer connector plug makes initial contact with a power line prior to the shorter plug, which reduces the onset of power surges. However, this scheme requires manual dexterity and specific insertion and removal timing for proper operation.

A connector assembly disclosed in U.S. Pat. No. 4,747,783 attempts to eliminate timing and control circuitry for power applications. This connector assembly uses a long pin in the "plug" to first make contact with its mating "socket" to gradually increase the voltage to the socket until the entire plug makes mating contact with the socket. The plug comprises a pin having a thin insulating material covering the surface and a thin low resistive material covering the insulating material. When the plug makes initial contact with the socket, the current must pass through the resistive portion of the plug. This permits the electronic components in the peripheral device to charge gradually and eliminates the current surges which may result.

This device is undesirable for several reasons. First, it requires the use of several contacts of differing lengths, thereby raising manual dexterity problems. Secondly, although the low resistance (i.e. 2–60 ohms) is sufficient to eliminate current surges in power transmissions, it is not sufficient to eliminate the voltage pulse from being introduced into the electronic system. In addition, the thin layer of low resistive material surrounding the thin layer of insulating material introduces an additional problem into the connection between the peripheral device and the electronic system; short capacitance. As explained previously, capacitance is undesirable in a connector.

It would be desirable to provide a signal connector assembly that would not introduce errors into an electronic system during a hot plug.

SUMMARY OF THE INVENTION

The present invention provides a plug contact having a high resistive portion within a plug for use in a signal connector assembly. When the plug of the assembly first makes contact with the receptacle contacts within a mating receptacle, the high resistive portion of the plug contact prevents a voltage spike. To prevent voltage pulses, resistive portions with resistances ranging from $10K\Omega$ to $1G\Omega$ are necessary depending upon the application. As the plug is further inserted into the receptacle, the energy flow is gradually increased. Eventually, the receptacle contacts within the receptacle pass the high resistive portion and make contact with the conductive portion of the plug contact, thereby permitting transmission of valid signals without the generation of spurious errors. In an alternative embodiment, the receptacle contact, or both the plug contact and the receptacle contact, may have the high resistive portion.

It is an object of the present invention to provide a connector assembly which permits connection of a peripheral device to an energized electronic system without introducing any spurious errors into that system.

Other objects and advantages of the present invention will become apparent after reading the detailed description of the presently preferred embodiment.

DETAILED DESCRIPTION OF THE PREFERRED EMBODIMENT

The preferred embodiment will be described with reference to the drawing figures wherein like numerals represent like elements throughout.

Figure 1:
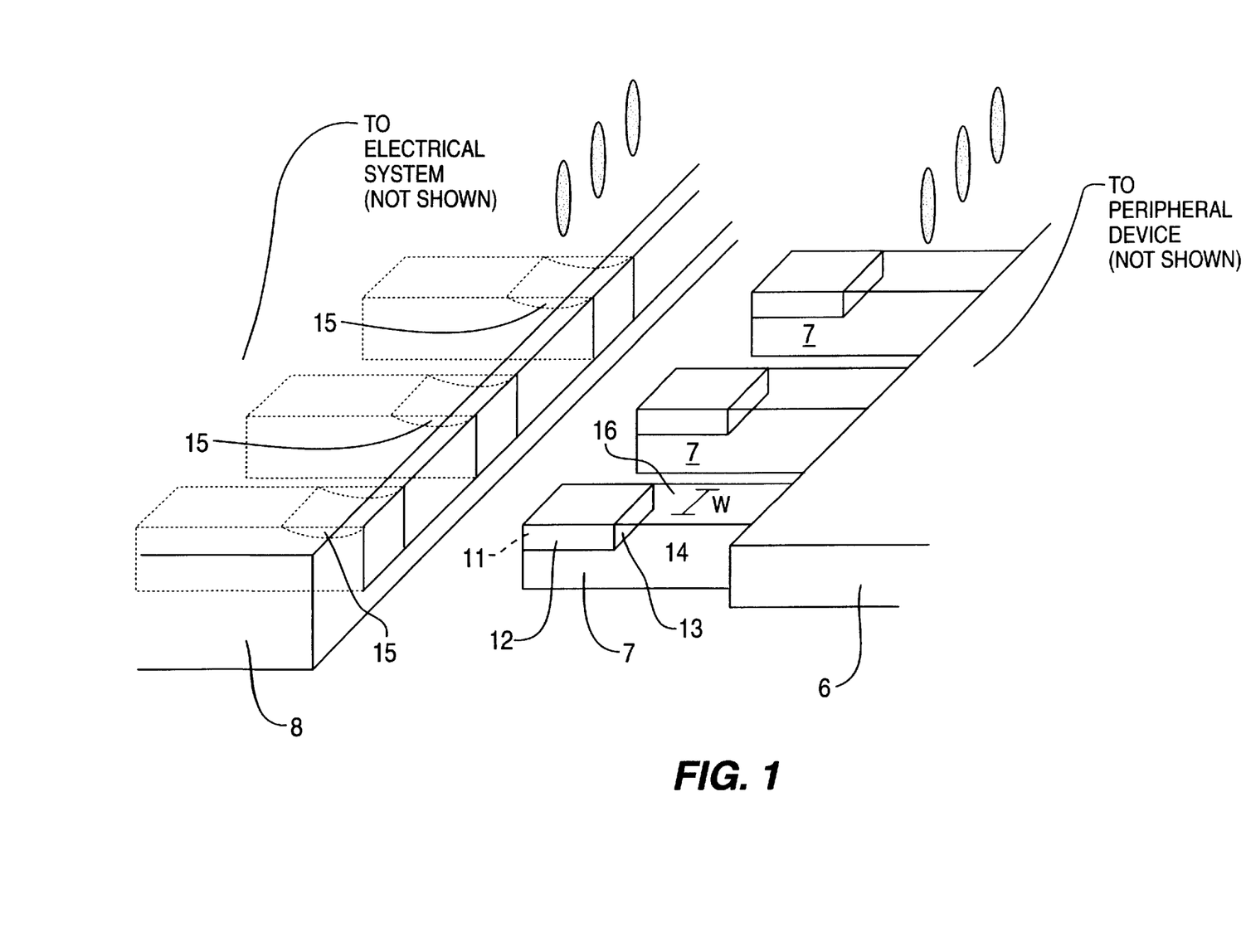
FIG. 1 is an isometric view of a simplified illustration of the present invention.

Referring to FIG. 1, the preferred embodiment of the connector assembly of the present invention comprises a plug 6 for mating with a corresponding receptacle 8. It should be recognized that although only one plug contact 7 is shown in detail for simplicity, there are typically at least two or more plug contacts 7 within every plug 6 for mating with corresponding receptacle contacts 15. The shape of the plug 6 is not central to the present invention. For simplicity, the plug 6 and plug contact 7 are illustrated as rectangular, although those of skill in the art will realize that many other shapes could be used without departing from the spirit of the present invention. The plug contact 7 comprises a conductive portion 14 disposed along a trailing surface portion which can be made from any conductive material, (such as brass, nickel, gold, copper or a superconductor, etc.) and a highly resistive portion 12. The resistive portion 12 is generally rectangular shaped and extends across the width W of the plug contact 7. The resistive portion 12 comprises a layer of highly resistive material inset into the surface 16 of the plug 6, with a first end 11 of the resistive portion 12 exposed to the receptacle 8 and a second end 13 of the resistive portion 12 in contact with the conductive portion 14.

A typical receptacle 8 includes a receptacle contact 15 for each corresponding plug contact 7 which electrically mates with its corresponding receptacle contact 15 as the plug 6 of the peripheral device (not shown) is inserted into receptacle 8 of the electronic system (not shown).

In operation, the first end of the plug 6 is inserted into the cavity of the receptacle 8. The receptacle contact 15 will make first contact with the resistive portion 12. Since it is contemplated that the electronic system will be energized, this will permit energy from the electronic system to begin flowing from the receptacle contact 15, through the resistive portion 12 and into the conductive portion 14 of the plug contact 7. The resistive portion 12 reduces the magnitude of voltage pulses such that they will not present errors into the electronic system, as will be explained in detail hereinafter. A portion of the voltage "seen" by the plug 6 will drop across the resistive portion 12. As the plug 6 is inserted further into the receptacle 8, the receptacle contact 15 passes along the surface 16 of the resistive portion 12 until it finally reaches the conductive portion 14 of the plug contact 7. When the plug 6 is fully inserted into the receptacle 8, the receptacle contact 15 will be in direct contact with the conductive portion 14 of the plug contact 7. Accordingly, there will be no voltage drop across the resistive portion 12 of the plug contact 7. With respect to capacitance, the arrangement of the present invention specifically limits the capacitance between the metallic portions of the plug and receptacle contacts 7, 15, (it bypasses the high resistance), to an acceptably low level. It does this by minimizing their effective coupling area and the effective dielectric constant between them, which is primarily air.

A primary aspect of preventing a voltage pulse is to reduce the initial voltage seen by plug contact 7 upon insertion of the plug 6 into the receptacle 8. Referring to the test setup 94 and the graph of FIG. 2, it can clearly be seen that the resistive portion 12 reduces the initial voltage seen by the receptacle contact 15. The graph represents the voltage seen by the receptacle contact 15 as the plug 6 is removed from the receptacle 8. Referring to the portion of the graph to the left of point 92, this shows a short circuit voltage of 0V across the plug contact 7 while the plug contact 7 is in full contact with the receptacle contact 15. At point 92, the receptacle contact 15 contacts the resistive portion 12. The resistive portion 12 permits the voltage as seen across the receptacle contact 15, to increase gradually along the sloped (or curved) portion 93 of the graph as the plug 6 is removed from the receptacle 8. At point 91, the receptacle contact 15 no longer contacts the plug contact 7. Accordingly, 5v is seen by the receptacle contact 15. Curve 93 shows the gradual transition between points 91 and 92 which prevents voltage pulses which will prevent the introduction of errors into the system. Obviously, one skilled in the art would clearly recognize that the graph would be reversed upon insertion of a plug 6 into a receptacle 8.

Figure 2:
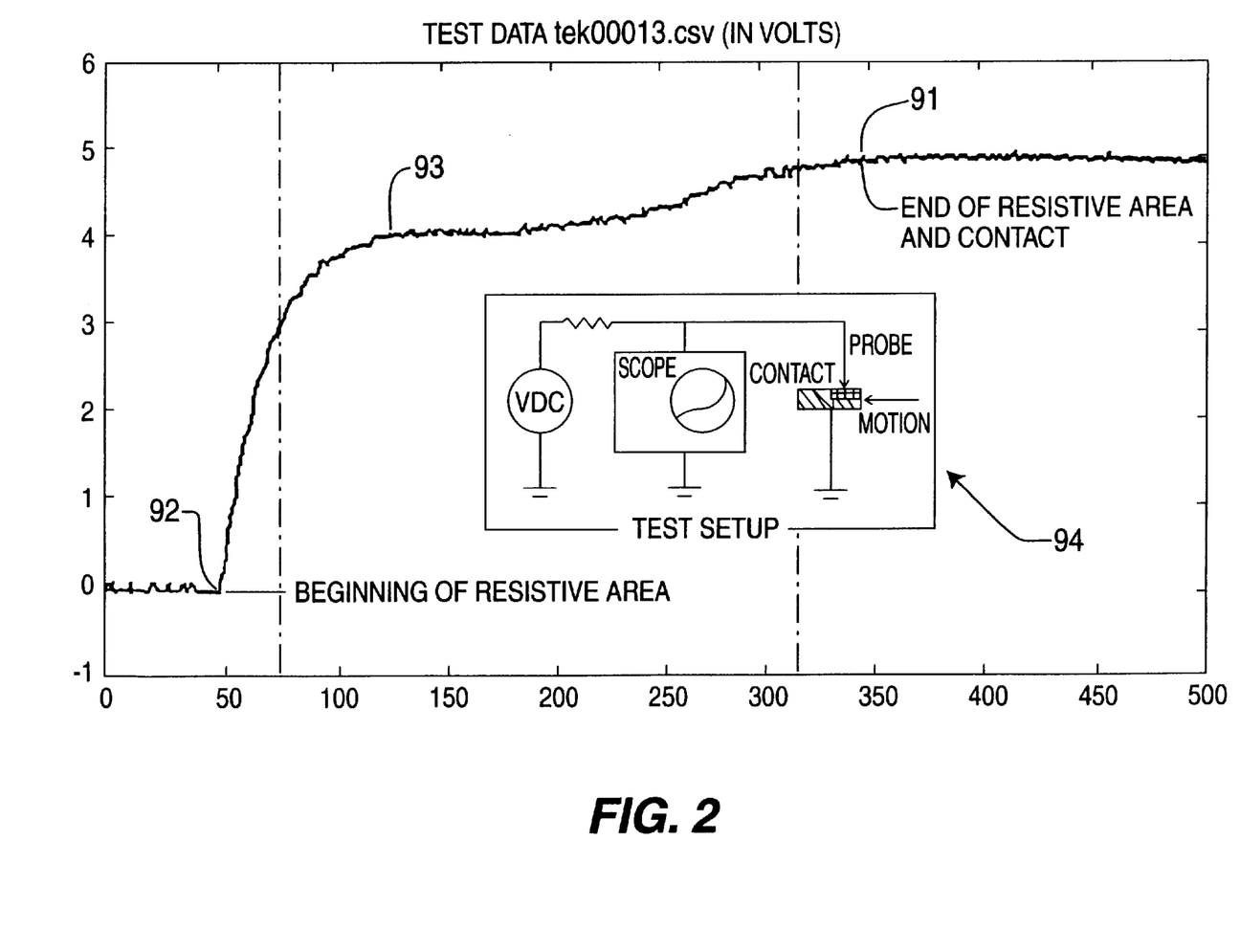
FIG. 2 is a graph of voltage versus distance traveled along the high resistive portion.

The high resistance of resistive portion 12 limits the rate of flow of current from the system bus to the "cold" device being hot-plugged into the system. The evidence of too fast a current transfer is a transient voltage pulse at the connection to the operating system. The transient voltage pulse decays as it propagates along the system bus, primarily because the bus and other attached devices are sources of charge. Accordingly, the high resistance slows the charge transfer enough to provide time for the charge to be adequately replaced. If the voltage cannot dip below the sensing threshold of an adjacent device, an error cannot occur.

Figure 3:
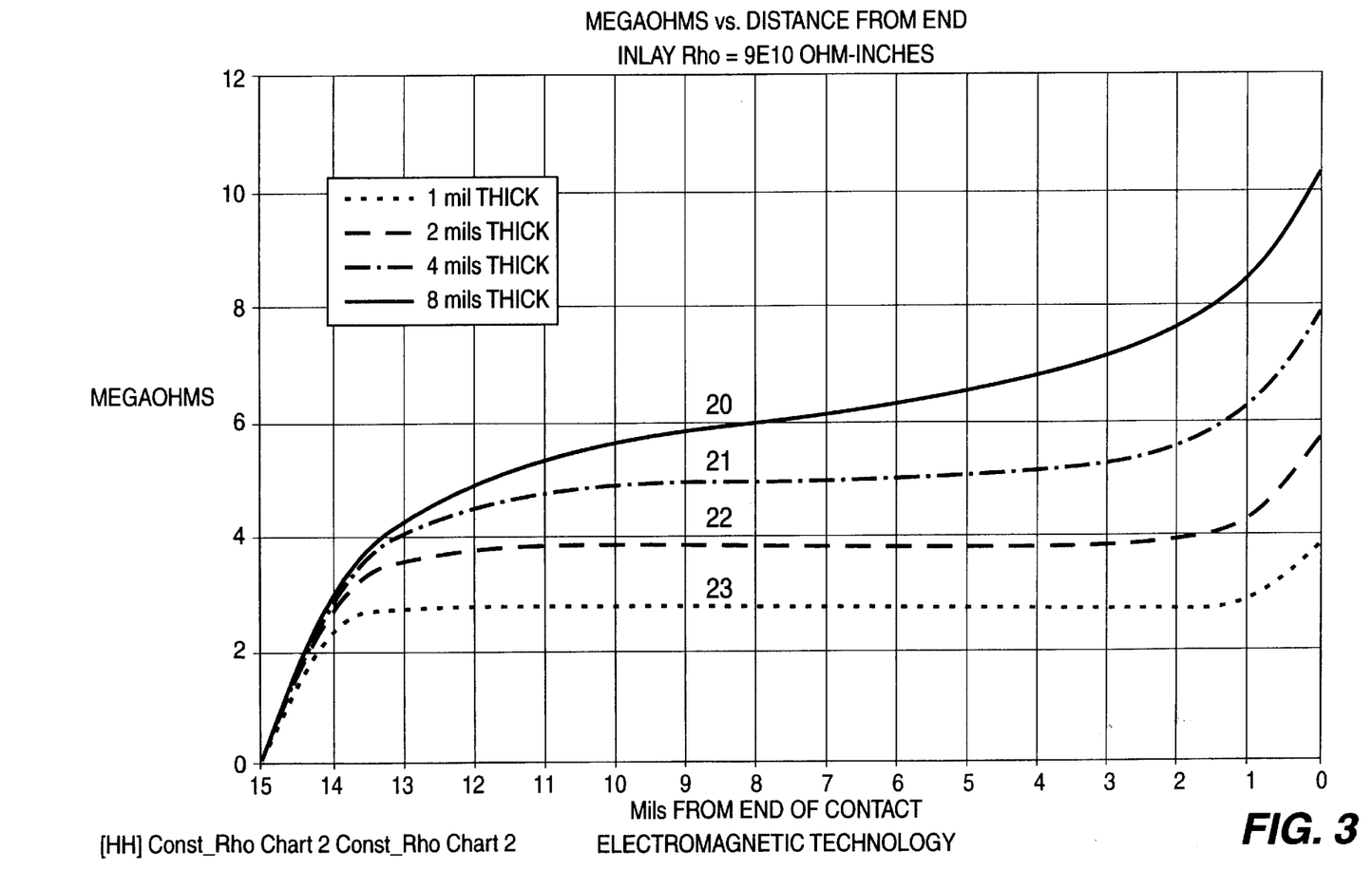
FIG. 3 is a graph of megaohms versus distance traveled along the high resistive portion with curves depicting varying thicknesses of the portion.

FIG. 3 is a graph of the electrical resistance as measured from the end of the plug contact 7. This graph is based on a resistive portion 12 of a rectangular shape 15 mils wide and 15 mils long. All other parameters were held constant. As shown, the resistance increases as the thickness of the resistive portion 12 increases. Referring to curve 20, when a resistive portion thickness of 8 mils is used, a resistance of 10 M$\Omega$ is achieved at the first end 11 of the plug contact 7, which gradually decreases until the second end 13 is reached where the resistance is nominally zero. Curves 21, 22 and 23 illustrate that the resistance decreases with a decrease in resistive portion thickness. The shape of the curves also differs as the resistive portion thickness is changed.

By changing both the resistivity and the geometry of the resistive portion 12, as those skilled in the art will realize, the present invention can be adapted to different uses and applications. However, it is also extremely important to reduce the short capacitance to a negligible level. The short capacitance is reduced by keeping the thickness of the resistive portion relatively thick, (i.e. in applying the present invention to a SCSI Bus, typically approximately 5 mils). By adjusting the resistivity and thickness of the resistive portion, connector assemblies can be created with desirable characteristics by preventing voltage surges for various types of signals and applications.

Alternative embodiments of the present invention are shown in FIGS. 4a–4i. In the embodiment depicted in FIG. 4a, the resistive portion 12 has a tapered profile. By varying the shape of the tapered profile of the resistive portion, the resistive transition curves that result as the receptacle contact 15 passes over the resistive portion 12 can be varied as desired for a particular application.

Figure 4A:
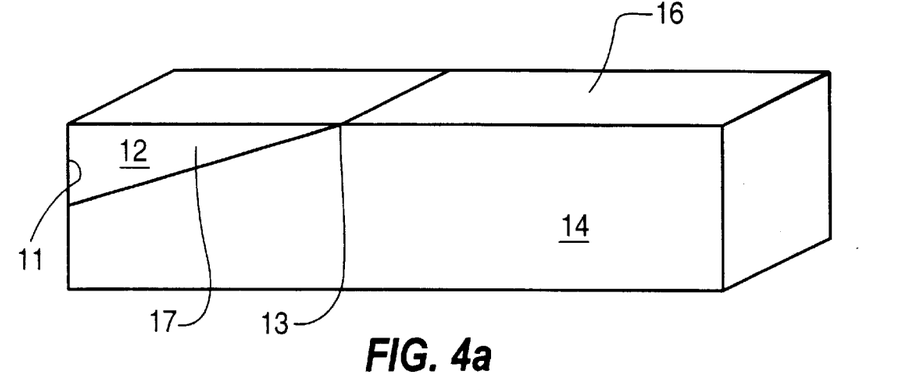
FIG. 4a is an alternative embodiment of the present invention with a tapered high resistive portion.
Figure 4B:
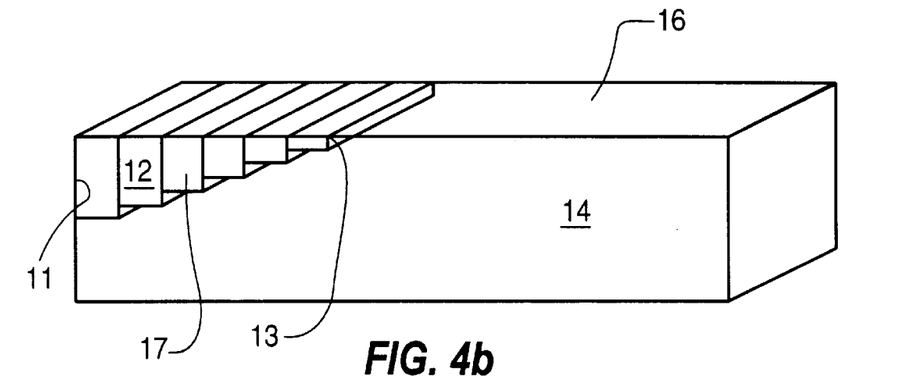
FIG. 4b is an alternative embodiment of the instant invention with a stepwise-tapered high resistive portion.

FIG. 4b depicts an alternative embodiment with the resistive portion 12 in a stepwise-tapered profile 17. By varying the steps between the steps, the resistive transition curves can be varied as desired.

Figure 4C:
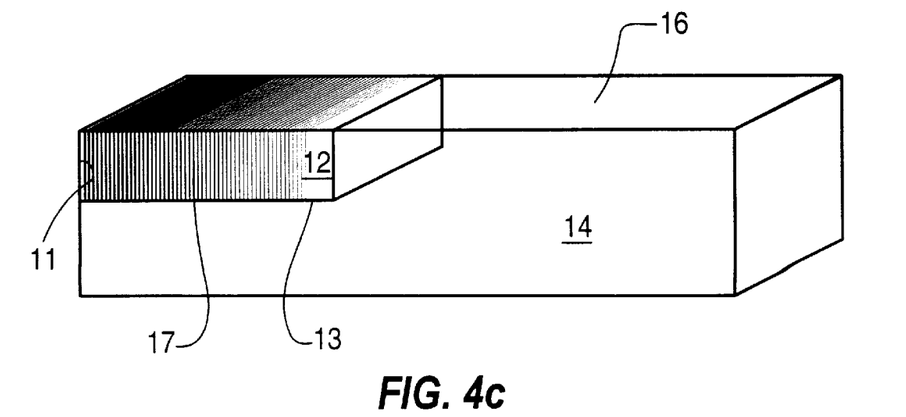
FIG. 4c is an alternative embodiment of the present invention with a resistive portion of mixed high resistive materials.

A third alternative embodiment is shown in FIG. 4c. The resistive portion 12 consists of two or more materials with varying resistivities the first material is disposed along the leading surface potion and the second material is disposed along a mid potion between the leading surface portion and the trailing surface portion.

Figure 4D:
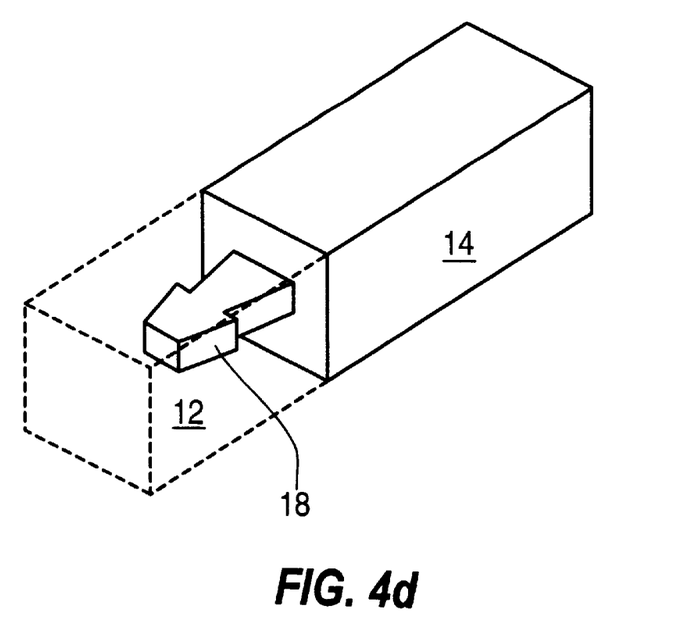
FIG. 4d is an alternative embodiment of the present invention with a conductive barb in the high resistive portion.
Figure 4E:
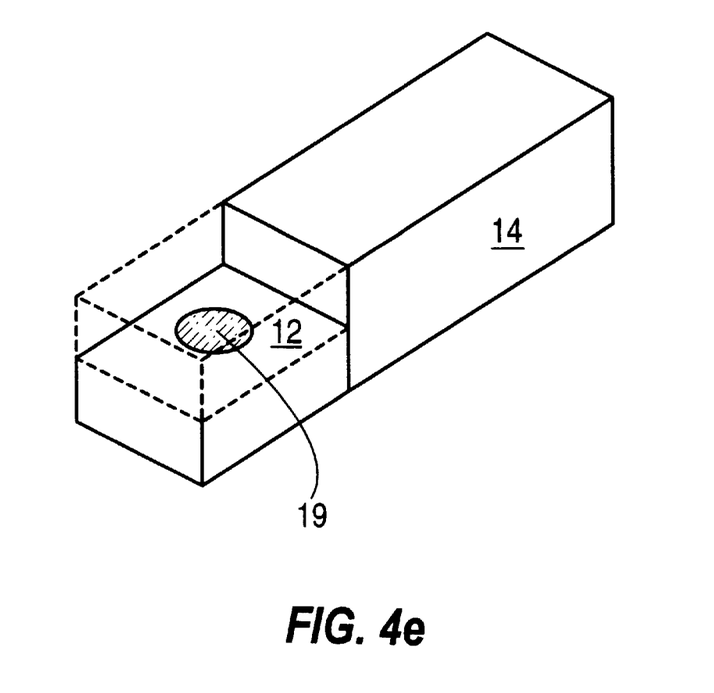
FIG. 4e is an alternative embodiment of the present invention with the high resistive portion extending into a hole in the conductive portion.

FIG. 4d, a fourth alternative embodiment shows, the resistive portion 12 extending from the conducting portion 14. A conducting barb 18 extends from the conducting body 14 into the resistive portion 12. A fifth alternative embodiment, FIG. 4e, has the resistive portion 12 extending into a hole 19 in the conducting portion 14. As those skilled in the art will note many other variations are possible without departing from the spirit of the invention. These varying embodiments can be used for varying the resistive transition curves for differing applications.

Figure 4F:
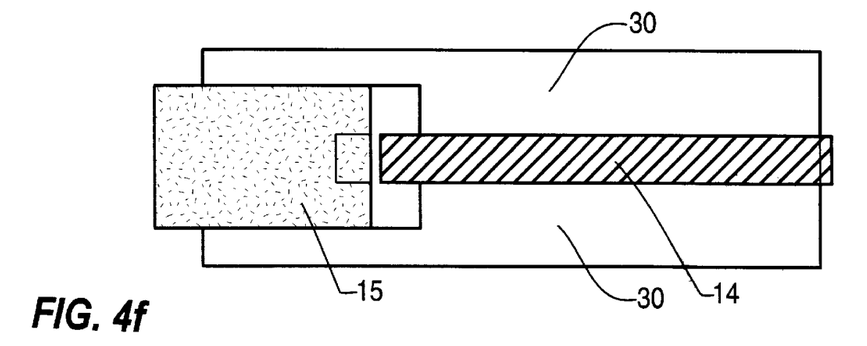
FIG. 4f is an alternative embodiment of the present invention with a high resistive housing.

FIG. 4f depicts a sixth embodiment. The conductive body 14 is surrounded by a high resistive housing. Receptacle contact 15 first makes contact with high resistive housing 30. As the receptacle contact 15 makes contact with conducting portion 14, the receptacle contact sees essentially no resistance.

Figure 4G:
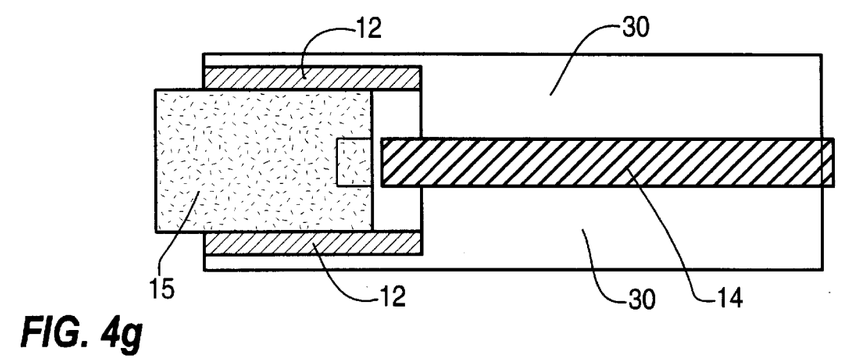
FIG. 4g is an alternative embodiment of the present invention with a high resistive inset in the housing.

In FIG. 4g, the housing 30 is non-conductive. However, high resistive portions 12 make initial contact with receptacle contact 15. The high resistive portions 12 are electrically connected and may be physically connected (not shown) to conducting portion 14.

Figure 4H:
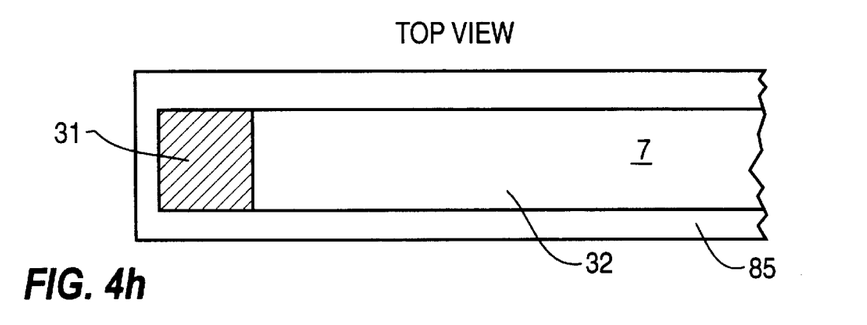
FIGS. 4h and 4i are an alternative embodiment of the present invention with a high resistance inset in the housing.
Figure 4I:
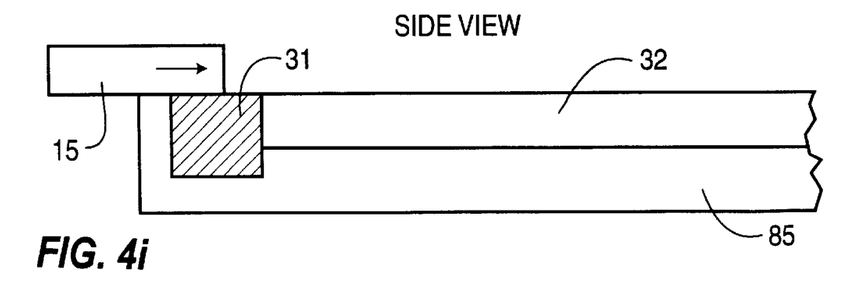

FIGS. 4h and 4i depict a plug contact 7 having a housing 85 surrounding a first high resistance 31 portion and a second low resistance portion 32. Upon full mating, the receptacle contact 15 is in full contact with the low resistance portion 32.

Figure 5:
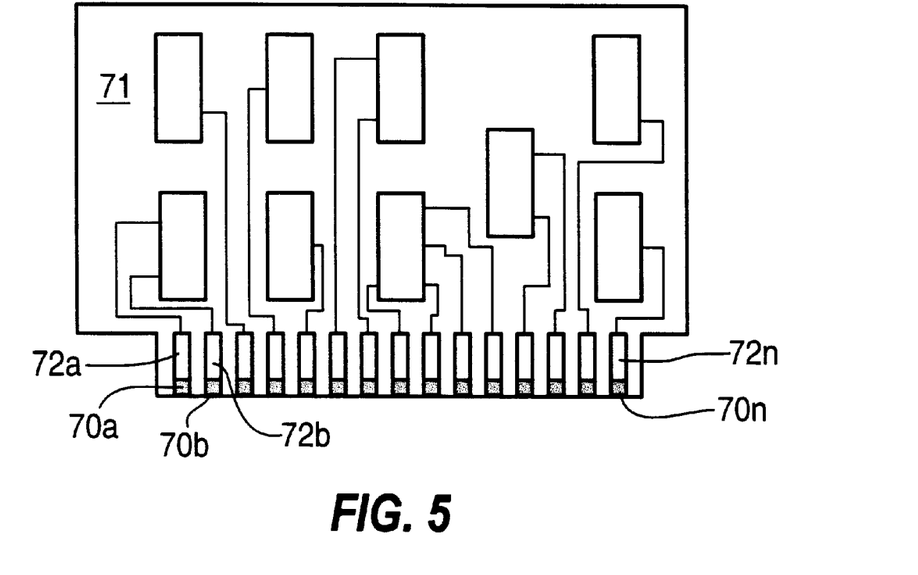
FIG. 5 is an illustration of the instant invention utilized on a circuit board.
Figure 6:
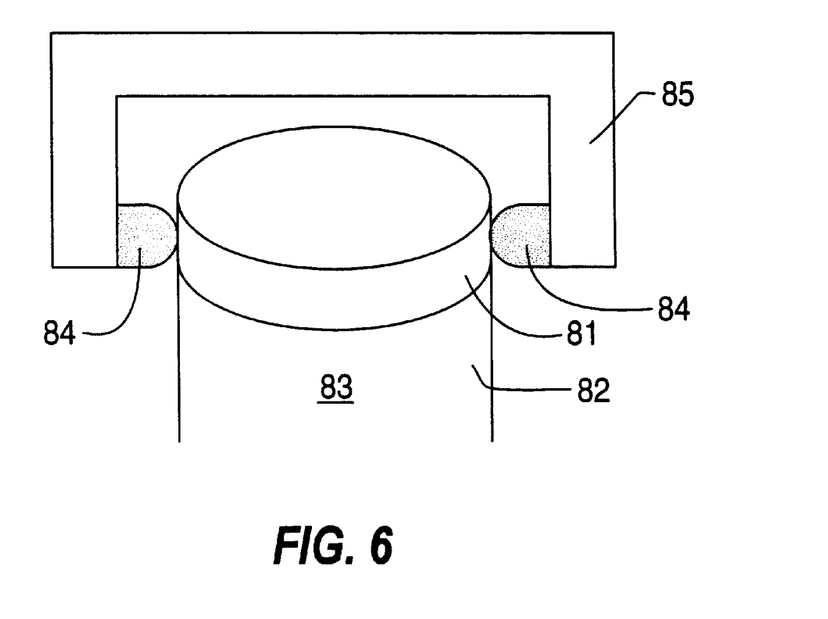
FIG. 6 is an illustration of the instant invention being used on a cylindrical connector.

FIG. 5 illustrates that the present instant invention may also be used with the contacts on a printed circuit board. The resistive portions 72A–70n of the instant invention may be employed in one or more plug contacts 72A–ηn on a conventional printed circuit board 71. FIG. 6 shows that the present invention may be adapted to various shaped applications. For instance, a plug 83 with a cylindrical shape with a resistive portion 81 and conductive portion 82. Receptacle contacts 84 within the receptacle 85 make contact with the resistive portion 81 prior to the conductive portion 82.

Figure 7:
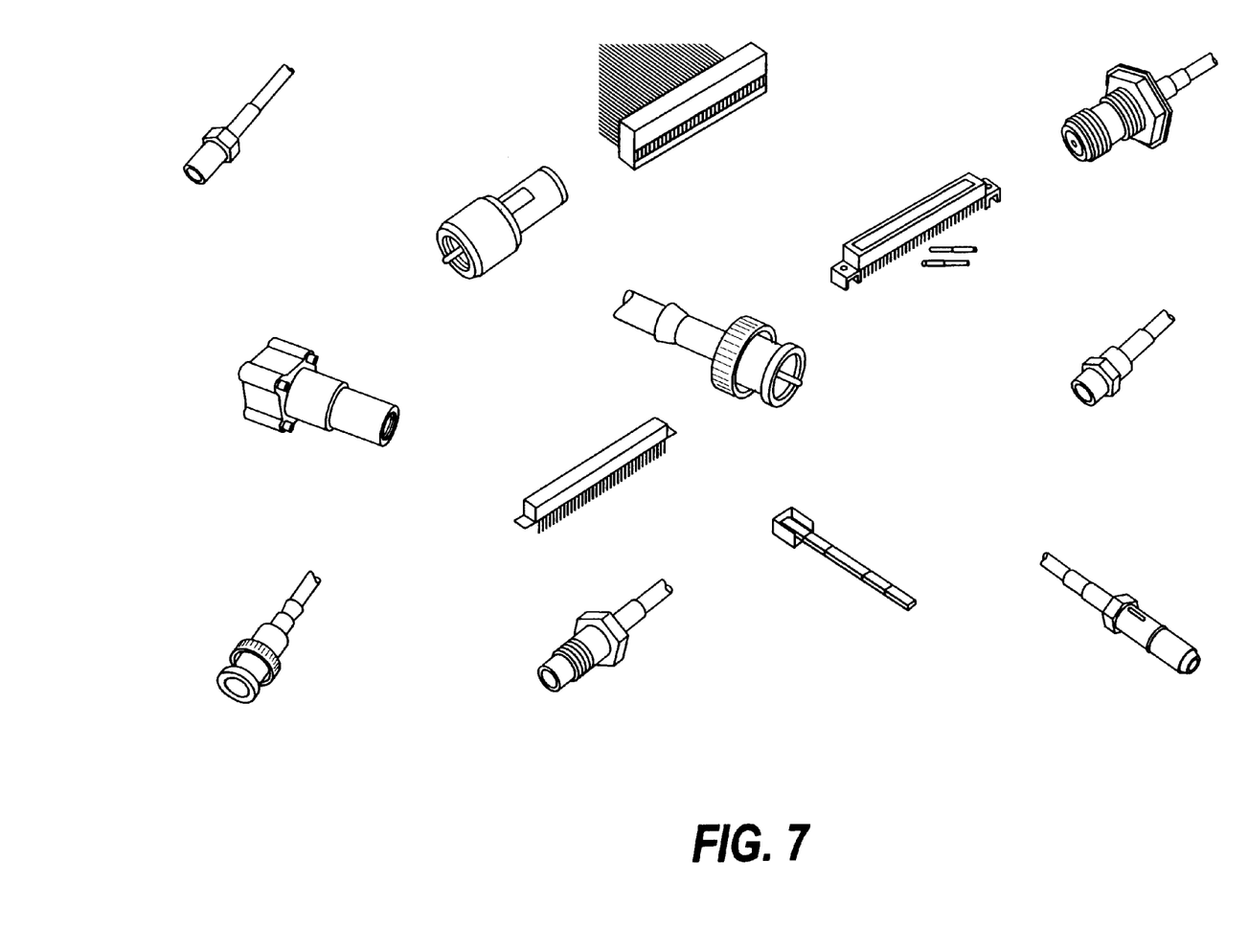
FIG. 7 is an illustration of the various prior art connectors.

FIG. 7 illustrates some prior art electrical connectors. The size and shape of the connectors vary. As those skilled in the art will realize, the present invention can be used with the contacts within these various connectors.

Although the invention has been described in part by making detailed reference to certain specific embodiments, such details are intended to be instructive rather than restrictive. It will be appreciated by those skilled in the art that many variations may be made in the structure and mode of operation without departing from the spirit and scope of the invention as disclosed in the teachings herein.

What is claimed is:

1. An electrical contact for error resistant coupling of electrical signals, the contact comprising:
    a contact mating portion comprising a conductive material and having selectively configured surface portions for slidingly engaging a mating contact to continuously define an electric signal connection between the contact and the mating contact, the surface portions comprising:
        a leading surface portion for initial direct engagement with the mating contact to produce an initial high resistance connection, the leading surface portion comprising a resistive material, a major surface of the resistive material applied directly to the conductive material; and
        a trailing surface portion for engagement with the mating contact when in a fully mated relationship to produce a relatively low resistance connection.

2. The improved contact as described in claim 1 wherein said leading surface portion is contiguous with said trailing surface portion to define a continuous surface.

3. The improved contact as described in claim 1 further comprising an intermediate surface portion defined by a material of lower resistivity than said leading surface material;
    wherein said mating contact sequentially engages said leading portion, said intermediate portion, and said trailing portion.

4. The improved contact as described in claim 3 wherein said intermediate surface portion is contiguous with said leading surface portion and said trailing surface portion to define a continuous surface.

5. The improved contact as described in claim 1 wherein said leading surface portion has decreasing thickness along the direction of sliding engagement.

6. The improved contact as described in claim 1 wherein said leading surface portion has decreasing resistivity along the direction of sliding engagement.

7. The improved contact as described in claim 2 wherein the leading portion material is inset in the trailing portion material.

8. The improved contact as described in claim 7 wherein said trailing portion material has a protrusion extending into said leading portion material.

9. The improved contact as described in claim 7 wherein said leading portion material has a protrusion extending into said trailing portion material.

10. The improved contact as described in claim 1 wherein said leading surface portion being defined by a material having a resistance between 10KΩ and 1GΩ.

11. An improved connector assembly for error resistive coupling of electrical signals, the connector assembly comprising:
    a first contact and a mating contact;
    said first contact comprising:
        a contact mating portion comprising a conductive material and having selectively configured surface portions for slidingly engaging said mating contact to continuously define an electric signal connection between said first contact and said mating contact, the surface portions comprising:
            a leading surface portion for initial direct engagement with the mating contact to produce an initial high resistance connection, the leading surface portion comprising a resistive material, a major surface of the resistive material applied directly to the conductive material; and
            a trailing surface portion for engagement with the mating contact when in a fully mated relationship to produce a relatively low resistance connection.

12. The improved connector assembly as described in claim 11 wherein said leading surface portion is contiguous with said trailing surface portion to define a continuous surface.

13. The improved connector assembly as described in claim 11 further comprising an intermediate surface portion defined by a material of lower resistance than said leading surface material;

wherein said mating contact sequentially engages said leading portion, said intermediate portion, and said trailing portion.

14. The improved connector assembly as described in claim 13 wherein said intermediate surface portion is contiguous with said leading surface portion and said trailing surface portion to define a continuous surface.

15. The improved connector assembly as described in claim 11 wherein said leading surface portion has decreasing thickness along the direction of sliding engagement.

16. The improved connector assembly as described in claim 11 wherein said leading surface portion has decreasing resistivity along the direction of sliding engagement.

17. The improved connector assembly as described in claim 12 wherein the leading portion material is inset in the trailing portion material.

18. The improved connector assembly as described in claim 17 wherein said trailing portion material has a protrusion extending into said leading portion material.

19. The improved connector assembly as described in claim 17 wherein said leading portion material has a protrusion extending into said trailing portion material.

20. The improved connector assembly as described in claim 11 wherein said leading surface portion being defined by a material having a resistance between 10KΩ and 1GΩ.

21. The improved connector assembly as described in claim 11 wherein said first contact has a housing; said leading surface portion is part of the housing and is electrically connected to said trailing portion.

22. The improved connector assembly as described in claim 11 wherein said first contact has a high resistive housing which makes contact with said trailing portion material; said leading surface portion is part of the housing.

23. The improved connector assembly as described in claim 11 wherein said first contact is made of an anisotropic resistive material with a high resistive portion and a low resistive portion;

said first contact surface portion being a part of said high resistive portion; and a second contact surface portion being a part of said low resistive portion.

24. An improved contact as described in claim 11 wherein said first contact has a housing; said leading surface portion is part of the housing and is electrically connected to said trailing portion.

25. An improved contact as described in claim 11 wherein said first contact has a high resistive housing which makes contact with said trailing portion material; said leading surface portion is part of the housing.

* * * * *